(12) United States Patent
Kidoh et al.

(10) Patent No.: US 8,017,993 B2
(45) Date of Patent: Sep. 13, 2011

(54) NONVOLATILE SEMICONDUCTOR MEMORY DEVICE AND METHOD FOR MANUFACTURING SAME

(75) Inventors: Masaru Kidoh, Tokyo (JP); Hiroyasu Tanaka, Tokyo (JP); Yosuke Komori, Kanagawa-ken (JP); Megumi Ishiduki, Kanagawa-ken (JP); Ryota Katsumata, Kanagawa-ken (JP); Masaru Kito, Kanagawa-ken (JP); Yoshiaki Fukuzumi, Kanagawa-ken (JP); Hideaki Aochi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 196 days.

(21) Appl. No.: 12/405,522

(22) Filed: Mar. 17, 2009

(65) Prior Publication Data

US 2009/0321813 A1   Dec. 31, 2009

(30) Foreign Application Priority Data

Jun. 30, 2008   (JP) .................................. 2008-171009

(51) Int. Cl.
*H01L 29/792* (2006.01)
(52) U.S. Cl. . 257/324; 257/316; 257/326; 257/E29.309; 257/E21.209; 438/216
(58) Field of Classification Search .................. 257/316, 257/324, 326, 296, 300, 306, 390, E27.075, 257/E27.076, E27.077, E27.078, E27.084, 257/E27.085, E27.098, E27.102, E29.309, 257/E29.33, E21.209, E21.613, E21.645, 257/E29.267, E29.274, E29.318, E21.646, E21.661, E21.662, E21.679, E27.08; 438/216, 261, 591, 592, 593, 595
See application file for complete search history.

(56) References Cited

U.S. PATENT DOCUMENTS

| | | | | |
|---|---|---|---|---|
| 7,135,726 B2 * | 11/2006 | Endoh et al. | ................... | 257/296 |
| 7,795,673 B2 * | 9/2010 | Ou et al. | ....................... | 257/331 |
| 2003/0015755 A1 * | 1/2003 | Hagemeyer | ................... | 257/329 |
| 2008/0258203 A1 * | 10/2008 | Happ et al. | ..................... | 257/324 |
| 2009/0026460 A1 * | 1/2009 | Ou et al. | ......................... | 257/66 |

FOREIGN PATENT DOCUMENTS

JP   2007-266143   10/2007

OTHER PUBLICATIONS

U.S. Appl. No. 12/696,544, filed Jan. 29, 2010, Kidoh, et al.

* cited by examiner

*Primary Examiner* — Cuong Q Nguyen
*Assistant Examiner* — Yosef Gebreyesus
(74) *Attorney, Agent, or Firm* — Oblon, Spivak, McClelland, Maier & Neustadt, L.L.P.

(57) ABSTRACT

A nonvolatile semiconductor memory device includes: a stacked body with a plurality of insulating films and electrode films alternately stacked therein, through which a through hole extending in the stacking direction is formed; a semiconductor pillar buried inside the through hole; and a charge storage layer located on both sides of each of the electrode films in the stacking direction and insulated from the electrode film and the semiconductor pillar.

11 Claims, 12 Drawing Sheets

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2008-171009, filed on Jun. 30, 2008; the entire contents of which are incorporated herein by reference.

BACKGROUND OF THE INVENTION

1. Field of the Invention

This invention relates to a nonvolatile semiconductor memory device with a plurality of insulating films and a plurality of electrode films alternately stacked therein, and a method for manufacturing the same.

2. Background Art

Conventionally, nonvolatile semiconductor memory devices such as flash memories have been fabricated by two-dimensionally integrating elements on the surface of a silicon substrate. In this type of flash memory, downscaling by decreasing the dimensions of each element is required to reduce cost per bit and increase memory capacity. However, such downscaling has been difficult in terms of cost and technology.

Numerous ideas for three-dimensionally integrating elements are proposed as techniques for breaking through the limit of integration. However, a three-dimensional device typically requires at least three lithography steps for each layer. Hence, cost increase associated with increased lithography steps cancels out cost reduction associated with decreased footprint on the silicon substrate. Thus, cost reduction is difficult despite three-dimensional construction.

In view of this problem, the present inventor and others proposed a simultaneously processed three-dimensional stacked memory (see, e.g., JP-A-2007-266143 (Kokai)). In this technique, electrode films and insulating films are alternately stacked on a silicon substrate to form a stacked body, and then through holes are simultaneously formed in this stacked body. A charge storage layer is formed on the side surface of the through hole, and silicon is buried inside the through hole to form a silicon pillar. Thus, a memory cell is formed at each intersection between the electrode film and the silicon pillar.

In this simultaneously processed three-dimensional stacked memory, information can be recorded by controlling the potential of each electrode film and each silicon pillar to transfer charge between the silicon pillar and the charge storage layer. In this technique, a plurality of electrode films are stacked on the silicon substrate to reduce the chip area per bit, achieving cost reduction. Furthermore, because the stacked body can be simultaneously processed to fabricate a three-dimensional stacked memory, increase in the number of stacked layers does not result in increasing the number of lithography steps, and cost increase can be limited.

However, the simultaneously processed three-dimensional stacked memory thus fabricated has a problem of increased interference between memory cells as its downscaling proceeds.

SUMMARY OF THE INVENTION

According to an aspect of the invention, there is provided a nonvolatile semiconductor memory device including: a stacked body with a plurality of insulating films and electrode films alternately stacked therein, through which a through hole extending in the stacking direction is formed; a semiconductor pillar buried inside the through hole; and a charge storage layer located on both sides of each of the electrode films in the stacking direction and insulated from the electrode film and the semiconductor pillar.

According to another aspect of the invention, there is provided a method for manufacturing a nonvolatile semiconductor memory device, including: forming a stacked body by alternately stacking a plurality of insulating films and electrode films; forming a through hole in the stacked body, the through hole extending in the stacking direction; etching the electrode films through the through hole; etching the insulating film through the through hole to form a recess at a boundary of the insulating film with the electrode film; forming a block insulating layer on a surface of the electrode film exposed to the inside of the through hole; forming a charge storage layer on a side surface of the through hole; etching the charge storage layer through the through hole to remove the charge storage layer from a side surface of a center portion of the insulating film in the stacking direction while leaving the charge storage layer in the recess; forming a tunnel insulating layer on the side surface of the through hole; and burying a semiconductor pillar inside the through hole.

DETAILED DESCRIPTION OF THE INVENTION

An embodiment of the invention will now be described with reference to the drawings.

Figure 1:
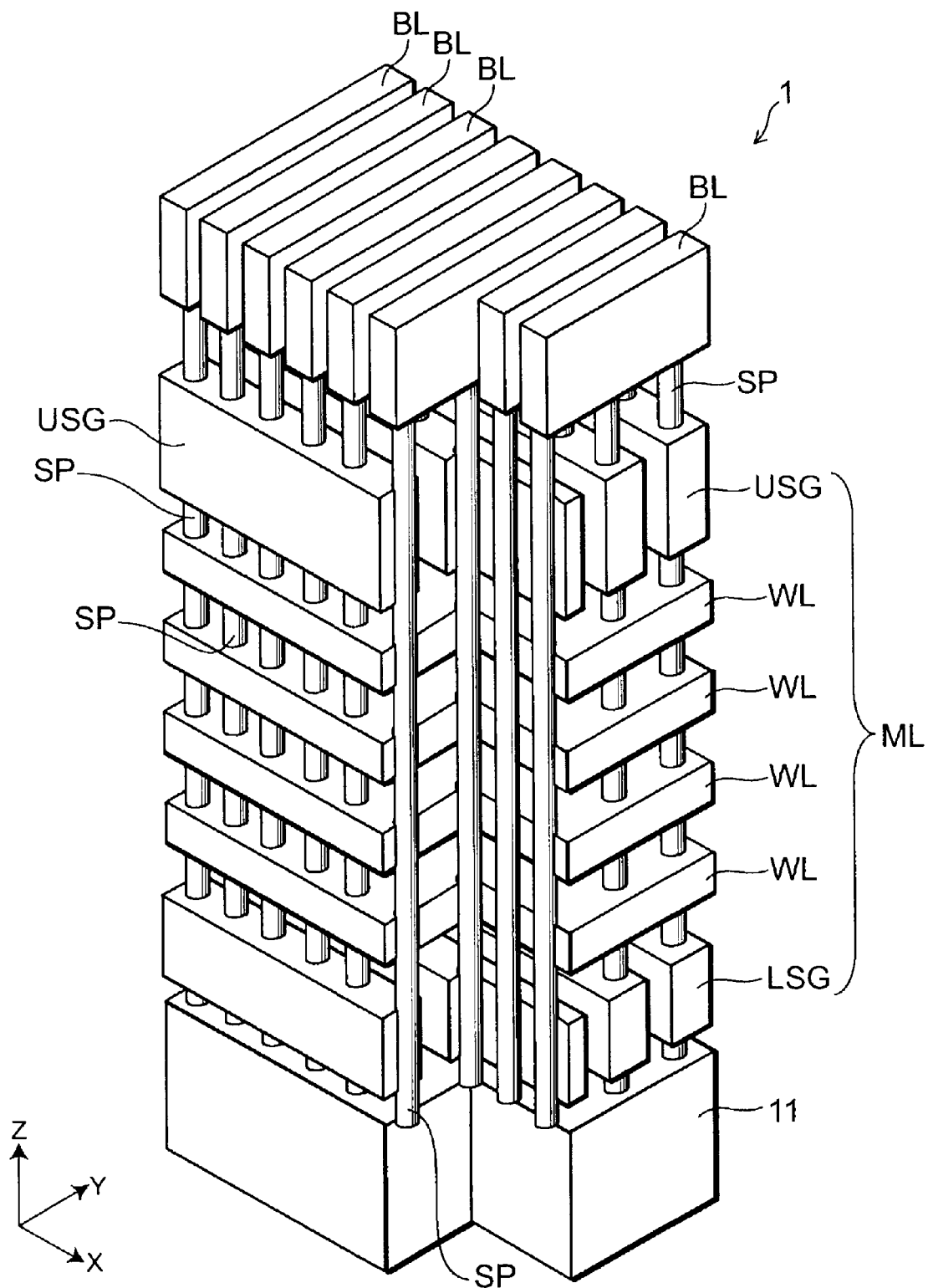
FIG. 1 is a perspective view illustrating a nonvolatile semiconductor memory device according to an embodiment of the invention.

FIG. 1 is a perspective view illustrating a nonvolatile semiconductor memory device according to this embodiment.

Figure 2:
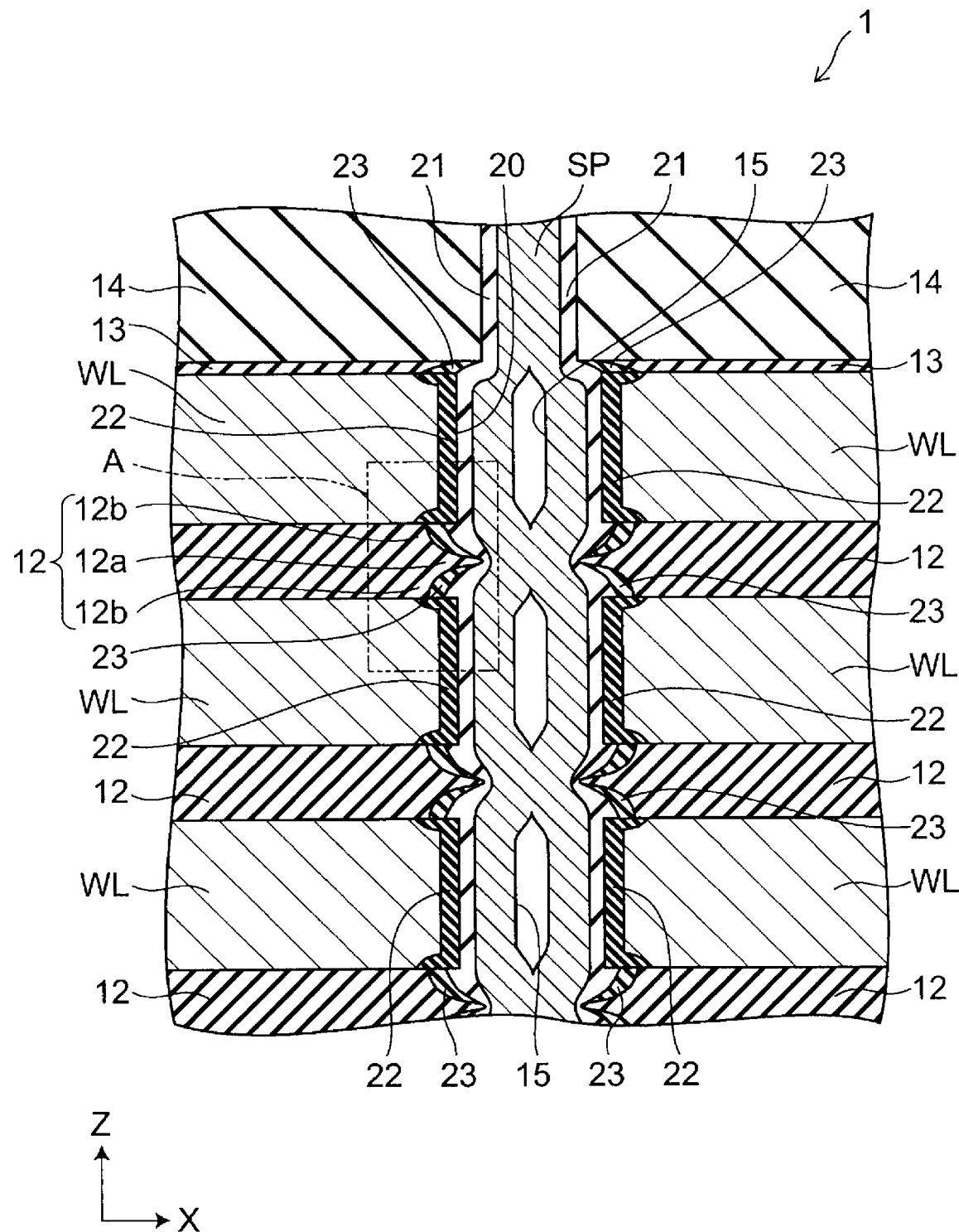
FIG. 2 is a cross-sectional view illustrating the nonvolatile semiconductor memory device according to this embodiment of the invention.

FIG. 2 is a cross-sectional view illustrating the nonvolatile semiconductor memory device according to this embodiment.

Figure 3:
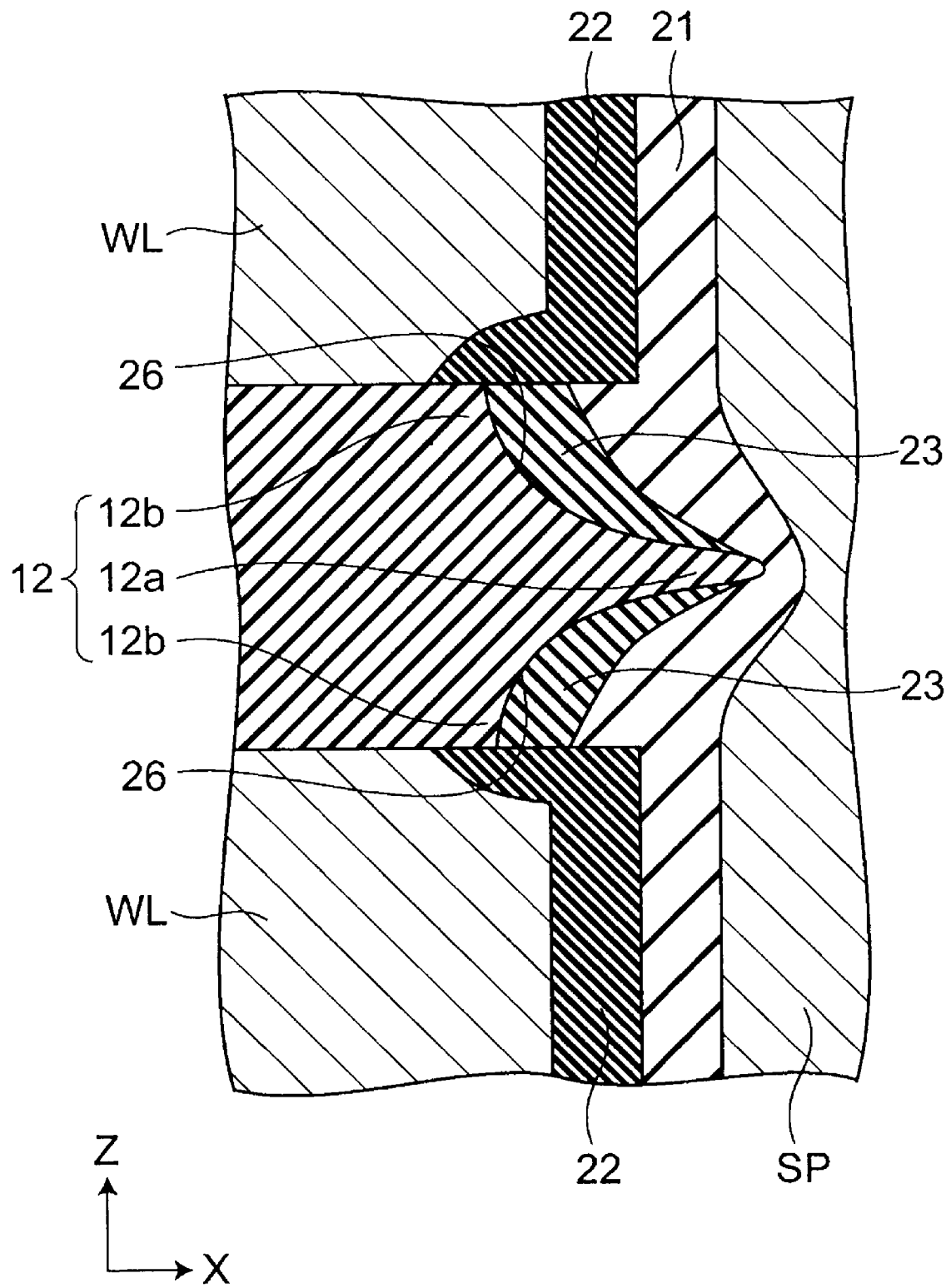
FIG. 3 is a partially enlarged cross-sectional view illustrating region A shown in FIG. 2.

FIG. 3 is a partially enlarged cross-sectional view illustrating region A shown in FIG. 2.

It is noted that in FIG. 1, for clarity of illustration, only the conductive portions are shown, and illustration of the insulating portions is omitted. Furthermore, FIG. 2 shows only part of one silicon pillar and its surroundings in the nonvolatile semiconductor memory device shown in FIG. 1.

As shown in FIGS. 1 and 2, the nonvolatile semiconductor memory device 1 (hereinafter also simply referred to as "device 1") according to this embodiment is a three-dimensionally stacked flash memory. As described later, in the device 1, cell transistors are arranged in a three-dimensional matrix configuration. Each cell transistor includes a charge storage layer, and functions as a memory cell for storing data by causing the charge storage layer to store charge. This embodiment is characterized in that the charge storage layer is divided for each cell transistor. In the following, the overall configuration of the device 1 is briefly described, and then the aforementioned characteristic portion of this embodiment is described in detail.

First, the overall configuration of the device 1 is briefly described.

As shown in FIGS. 1 and 2, the nonvolatile semiconductor memory device 1 according to this embodiment includes a silicon substrate 11 illustratively made of single crystal silicon. The silicon substrate 11 includes a memory array region to be populated with memory cells and a circuit region for driving the memory cells.

In the memory array region, a source line (not shown) is formed in the surface portion of the silicon substrate 11 by implantation. On the silicon substrate 11, an insulating film (not shown), a lower select gate LSG, and an insulating film (not shown) are stacked in this order to constitute a lower gate stacked body. The lower select gate LSG is formed from a conductive material, such as amorphous silicon or polysilicon provided with conductivity by impurity doping. The insulating film is formed from insulating material, such as silicon oxide.

Above the lower gate stacked body, a plurality of insulating films 12 and a plurality of electrode films WL are alternately stacked. The electrode film WL is formed from a conductive material, such as amorphous silicon or polysilicon provided with conductivity by impurity doping. The electrode film WL is subjected to a prescribed potential by a driver circuit (not shown) formed in the circuit region to function as a word line of the device 1. The insulating film 12 is illustratively formed from silicon oxide and functions as an interlayer insulating film for insulating the electrode films WL from each other.

A silicon oxide film 13 thinner than the insulating film 12 is provided on the uppermost electrode film WL, and a silicon nitride film 14 thicker than the insulating film 12 is provided thereon. The plurality of insulating films 12, the plurality of electrode films WL, the silicon oxide film 13, and the silicon nitride film 14 constitute a memory stacked body. Although the number of electrode films WL illustrated in FIG. 1 is four, the invention is not limited thereto.

Furthermore, above the memory stacked body, an insulating film (not shown), an upper select gate USG, and an insulating film (not shown) are stacked in this order to constitute an upper gate stacked body. The upper select gate USG is formed from a conductive material, such as amorphous silicon or polysilicon provided with conductivity by impurity doping. The insulating film is formed from an insulating material, such as silicon oxide.

In the following, for convenience of description, an XYZ orthogonal coordinate system is herein introduced. In this coordinate system, the two directions parallel to the upper surface of the silicon substrate 11 and orthogonal to each other are referred to as the X and Y direction, and the direction orthogonal to both the X and Y direction, that is, the stacking direction of the aforementioned films, is referred to as the Z direction.

The upper select gate USG and the lower select gate LSG are each formed so that one conductive film is divided along the Y direction into a plurality of wiring-shaped conductive members extending in the X direction. On the other hand, the electrode film WL is divided for each erasing block in which the electrode film WL is shaped like one conductive film parallel to the XY plane. Alternatively, the electrode film WL may also be divided along the Y direction like the upper select gate USG and the lower select gate LSG.

The lower gate stacked body, the memory stacked body, and the upper gate stacked body (hereinafter collectively referred to as "stacked body ML") include a plurality of through holes 20 (see FIG. 2) extending in the stacking direction (Z direction). Each through hole 20 penetrates entirely through the stacked body ML. The through holes 20 are illustratively arranged in a matrix configuration along the X and Y direction.

Inside each through hole 20 is buried a silicon pillar SP serving as a semiconductor pillar. The silicon pillar SP is formed from a semiconductor, such as amorphous silicon. Alternatively, the silicon pillar SP may be formed from other semiconductor materials, such as polysilicon, and the semiconductor material may or may not be doped with impurities. The silicon pillar SP is shaped like a column, such as a cylindrical column, extending in the Z direction. The silicon pillar SP is provided throughout the length of the stacked body ML in the stacking direction, and its lower end portion is connected to the silicon substrate 11.

A lower gate insulating film (not shown) is provided between the silicon pillar SP and the lower select gate LSG. Thus, a lower select transistor is formed in the lower gate stacked body, where the silicon pillar SP serves as a body region including a channel region, the lower gate insulating film serves as a gate insulating film, and the lower select gate LSG serves as a gate electrode.

Furthermore, an upper gate insulating film (not shown) is provided between the silicon pillar SP and the upper select gate USG. Thus, an upper select transistor is formed in the upper gate stacked body, where the silicon pillar SP serves as a body region including a channel region, the upper gate insulating film serves as a gate insulating film, and the upper select gate USG serves as a gate electrode.

A plurality of bit lines BL extending in the Y direction are provided above the insulating film on the upper select gate USG. The bit line BL is formed from a metal. Each bit line BL is provided so as to pass through the immediately overlying region of the silicon pillars SP of each column arranged along the Y direction, and is connected to the upper end portion of the silicon pillars SP. Thus, the silicon pillars SP are connected between the bit line BL and the silicon substrate 11. Furthermore, the silicon pillars SP for each column extending in the Y direction are connected to a different bit line BL.

Next, the characteristic portion of this embodiment is described.

As shown in FIGS. 2 and 3, a tunnel insulating layer 21 is formed entirely on the side surface of the through hole 20. The tunnel insulating layer 21 is illustratively formed from silicon oxide. The surface of the tunnel insulating layer 21 facing inside the through hole 20 is in contact with the outer surface of the silicon pillar SP.

Furthermore, a block insulating layer 22 is provided between the electrode film WL and the tunnel insulating layer 21. The block insulating layer 22 extends out away from the through hole 20 on the upper and lower surface of the electrode film WL so as to wrap around the upper and lower corner of the electrode film WL facing the through hole 20. The block insulating layer 22 is formed illustratively by oxidation of silicon forming the electrode film WL.

The center portion 12a of the insulating film 12 in the stacking direction (Z direction) protrudes toward the silicon pillar SP from the peripheral portion 12b of the insulating film 12, that is, the portion in contact with the electrode film WL.

A charge storage layer 23 is provided between the peripheral portion 12b of the insulating film 12 and the tunnel insulating layer 21 and between the center portion 12a of the insulating film 12 and the block insulating layer 22. Thus, the charge storage layer 23 is located on both sides of each electrode film WL in the Z direction. That is, two charge storage layers 23 are provided for each intersection between the silicon pillar SP and the electrode film WL. Thus, two charge storage layers 23 are provided per memory cell. As viewed in the Z direction, the charge storage layer 23 has an annular shape surrounding the silicon pillar SP. The charge storage layer 23 is formed from a material capable of trapping charge, such as silicon nitride.

The charge storage layer 23 is surrounded by the center portion 12a and the peripheral portion 12b of the insulating film 12, the block insulating layer 22, and the tunnel insulating layer 21. The tunnel insulating layer 21 is interposed between the charge storage layer 23 and the silicon pillar SP, and the block insulating layer 22 is interposed between the charge storage layer 23 and the electrode film WL. Thus, the charge storage layer 23 is insulated from the electrode film WL and the silicon pillar SP.

It is noted that the charge storage layer 23 is not provided between the center portion 12a of the insulating film 12 and the tunnel insulating layer 21. Thus, the adjacent charge storage layers 23 are separated from each other by the center portion 12a of the insulating film 12. Furthermore, the charge storage layer 23 is not provided also between the electrode film WL and the silicon pillar SP. Thus, the charge storage layers 23 located above and below each electrode film WL are also separated from each other.

Next, a method for manufacturing a nonvolatile semiconductor memory device according to this embodiment is described.

FIGS. 4 to 9 are process cross-sectional views illustrating the method for manufacturing the nonvolatile semiconductor memory device according to this embodiment.

First, as shown in FIG. 1, a device isolation film (not shown) is formed at a desired position in the upper portion of a silicon substrate 11. The memory array region is doped with impurities to form a diffusion layer (not shown) serving as a source line. On the other hand, P-wells, N-wells and the like are formed in the circuit region (not shown) to form sources/drains of transistors constituting each driver circuit. Next, gates of these transistors are formed.

Next, an insulating film (not shown) is formed on the memory array region of the silicon substrate 11. Next, amorphous silicon, for example, is deposited on this insulating film to form a lower select gate LSG. Next, an insulating film (not shown) is formed on the lower select gate LSG. Thus, a lower gate stacked body composed of the insulating film, the lower select gate LSG, and the insulating film is formed.

Next, through holes extending in the Z direction (stacking direction) and reaching the silicon substrate 11 are formed in the lower gate stacked body. Here, a plurality of through holes are simultaneously formed in a matrix configuration as viewed in the Z direction. Next, a silicon oxide film or silicon nitride film, for example, is deposited entirely on the lower gate stacked body, and then subjected to anisotropic etching such as RIE (reactive ion etching) so that the film is left only on the side surface of the through hole. Thus, a lower gate insulating film (not shown) is formed.

Subsequently, natural oxide film and the like are removed from the bottom surface of the through hole by dilute hydrofluoric acid treatment, and then amorphous silicon is buried in the through hole. Thus, the lower portion of the silicon pillar SP is buried in the through hole. Consequently, a lower select transistor is formed.

Figure 4:
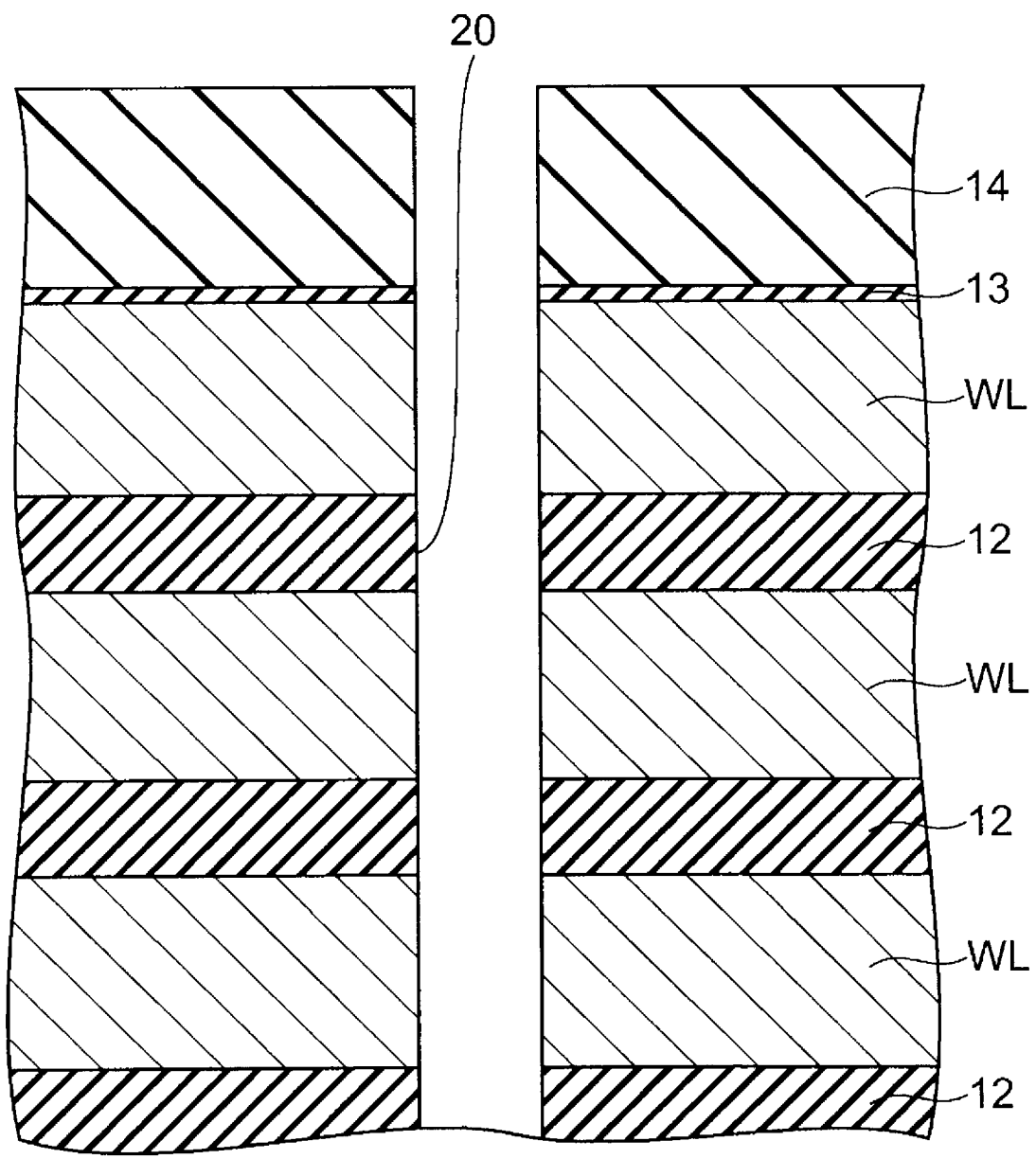
FIG. 4 is a process cross-sectional view illustrating a method for manufacturing the nonvolatile semiconductor memory device according to this embodiment.

Next, as shown in FIG. 4, insulating material, such as silicon oxide, is deposited on the lower gate stacked body to form an insulating film 12. Next, a conductive material, such as silicon doped with impurities, is deposited on the insulating film 12 to form an electrode film WL. Subsequently, the insulating film 12 and the electrode film WL are alternately stacked. By way of example, four layers are formed for each of the insulating film 12 and the electrode film WL. Next, a silicon oxide film 13 is formed, and a silicon nitride film 14 is formed. Thus, a memory stacked body is formed.

Next, photolithography and RIE are performed to form a through hole 20 in the memory stacked body. This through hole 20 extends in the Z direction and reaches the through hole formed in the lower gate stacked body. At this stage, the through hole 20 has a generally cylindrical shape, and the side surface of the through hole 20 is shaped like a generally straight line in the cross section parallel to the Z direction. The lower portion of the silicon pillar SP is exposed to the bottom of the through hole 20.

Figure 5:
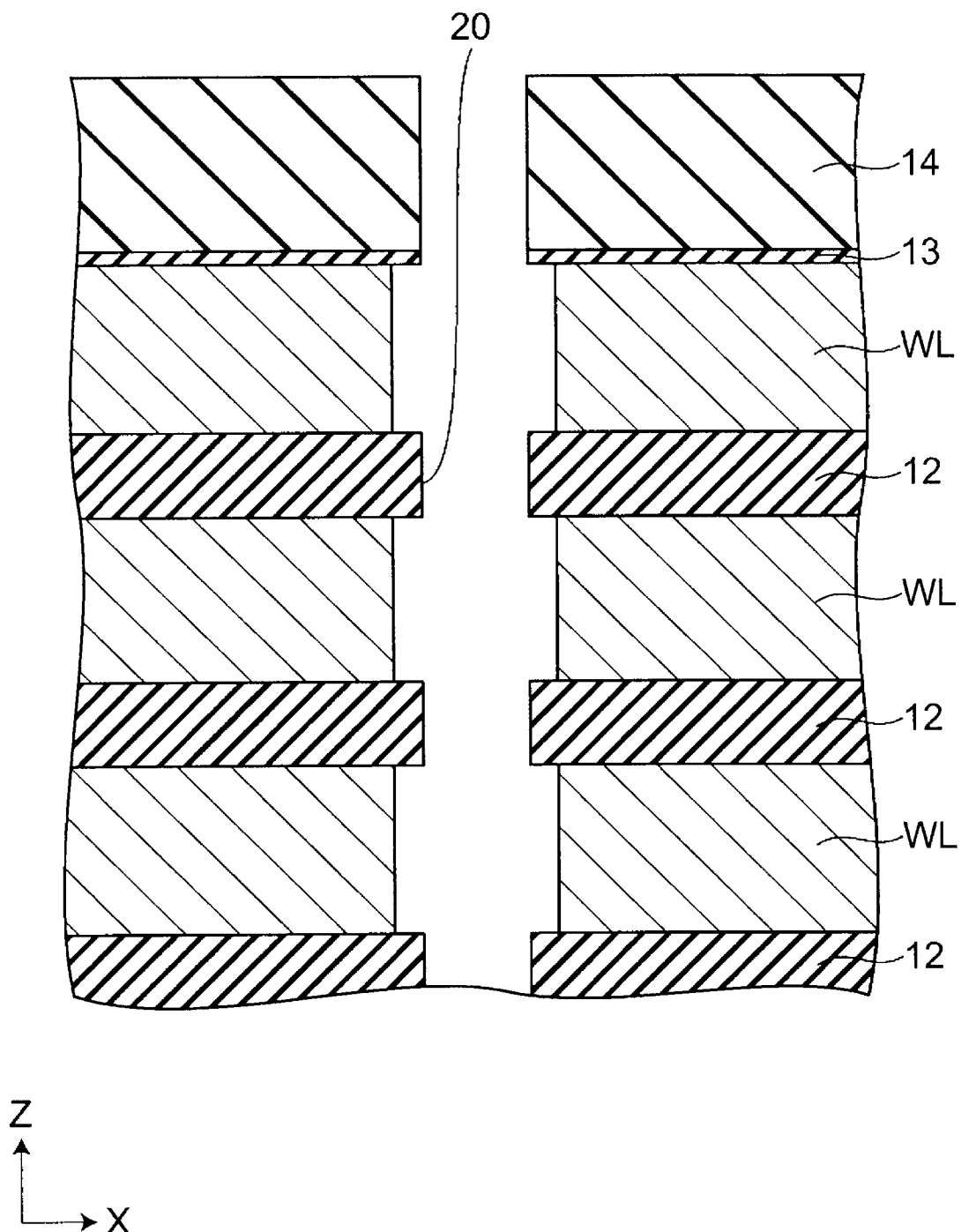
FIG. 5 is a process cross-sectional view illustrating the method for manufacturing the nonvolatile semiconductor memory device according to this embodiment.

Next, as shown in FIG. 5, wet etching is performed through the through hole 20. The condition for this wet etching is determined so that the etching selection ratio of silicon is high with respect to silicon oxide and silicon nitride. Thus, the electrode film WL made of amorphous silicon or polysilicon is selectively etched. Consequently, at the side surface of the through hole 20, the electrode film WL is set back from the insulating film 12, and the insulating film 12 relatively protrudes toward the inside of the through hole 20. Alternatively, in this step, CDE (chemical dry etching) may be performed instead of wet etching.

Figure 6:
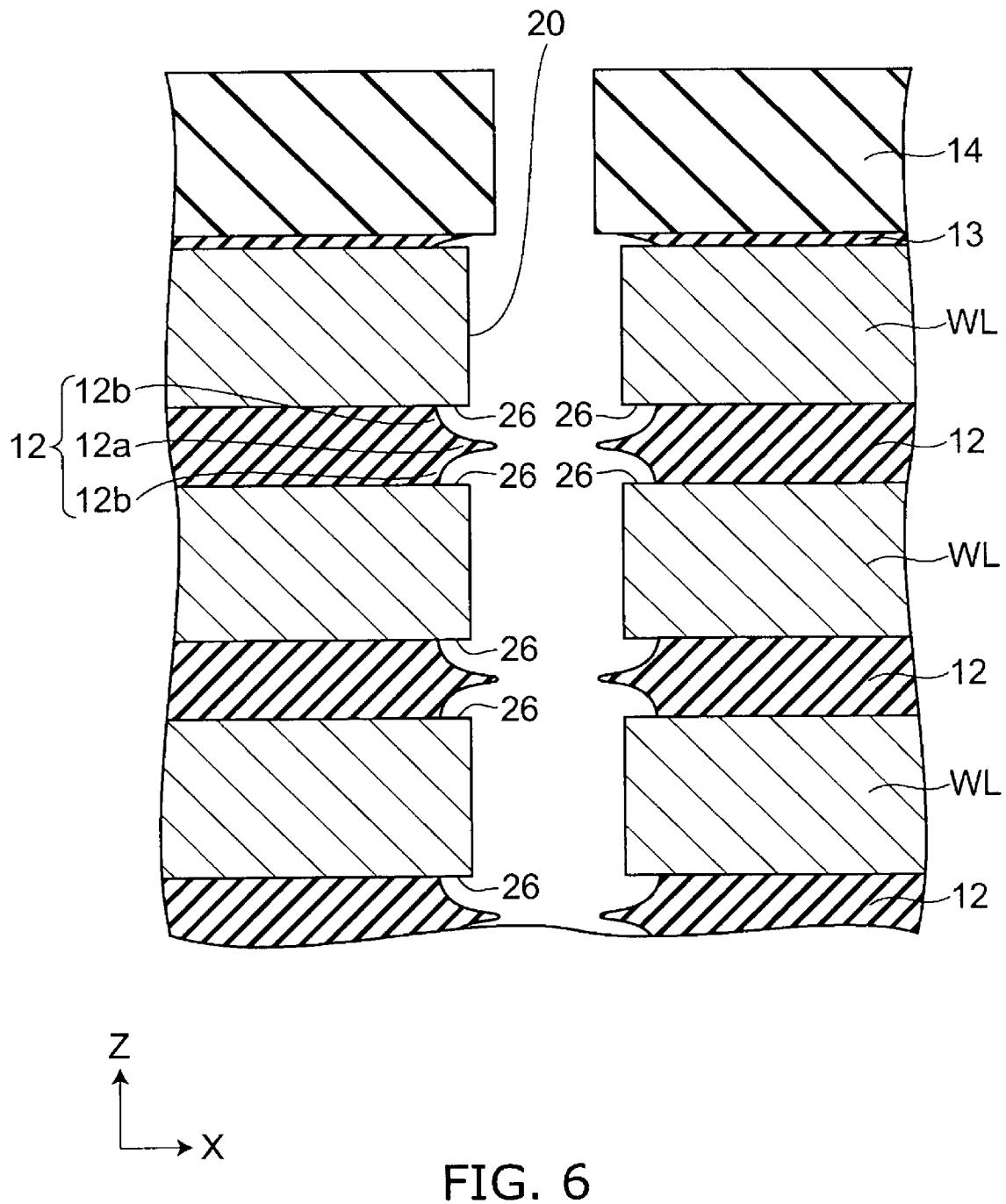
FIG. 6 is a process cross-sectional view illustrating the method for manufacturing the nonvolatile semiconductor memory device according to this embodiment.

Next, as shown in FIG. 6, wet etching is performed through the through hole 20. The condition for this wet etching is determined so that the etching selection ratio of silicon oxide is high with respect to silicon and silicon nitride. Thus, the insulating film 12 made of silicon oxide and the silicon oxide film 13 are isotropically etched. Consequently, the portion of the insulating film 12 protruding toward the inside of the through hole 20 is entirely rounded, and the vicinity of the interface with the electrode film WL is deeply etched, so that a peripheral portion 12b set back from the electrode film WL and a center portion 12a protruding toward the inside of the through hole 20 are formed. Thus, at the side surface of the through hole 20, a recess 26 is formed at the boundary of the insulating film 12 with the electrode film WL.

Figure 7:
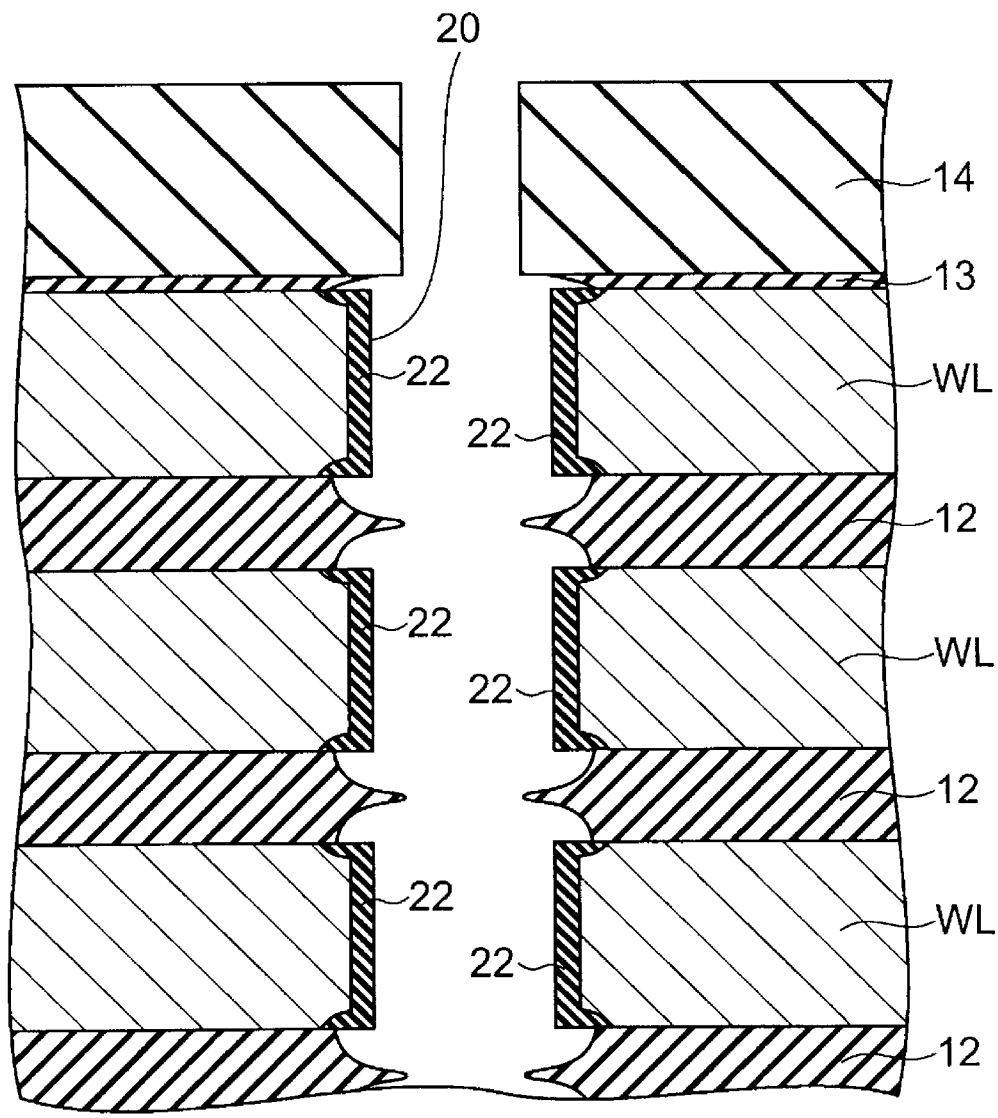
FIG. 7 is a process cross-sectional view illustrating the method for manufacturing the nonvolatile semiconductor memory device according to this embodiment.

Next, as shown in FIG. 7, thermal oxidation is performed. Thus, the portion of the electrode film WL exposed to the inside of the through hole 20 is oxidized to form a block insulating layer 22 made of silicon oxide. Alternatively, the block insulating layer 22 may be formed by CVD (chemical vapor deposition). In this case, the block insulating layer 22 is formed also on the side surface of the insulating film 12, the silicon oxide film 13, and the silicon nitride film 14.

Figure 8:
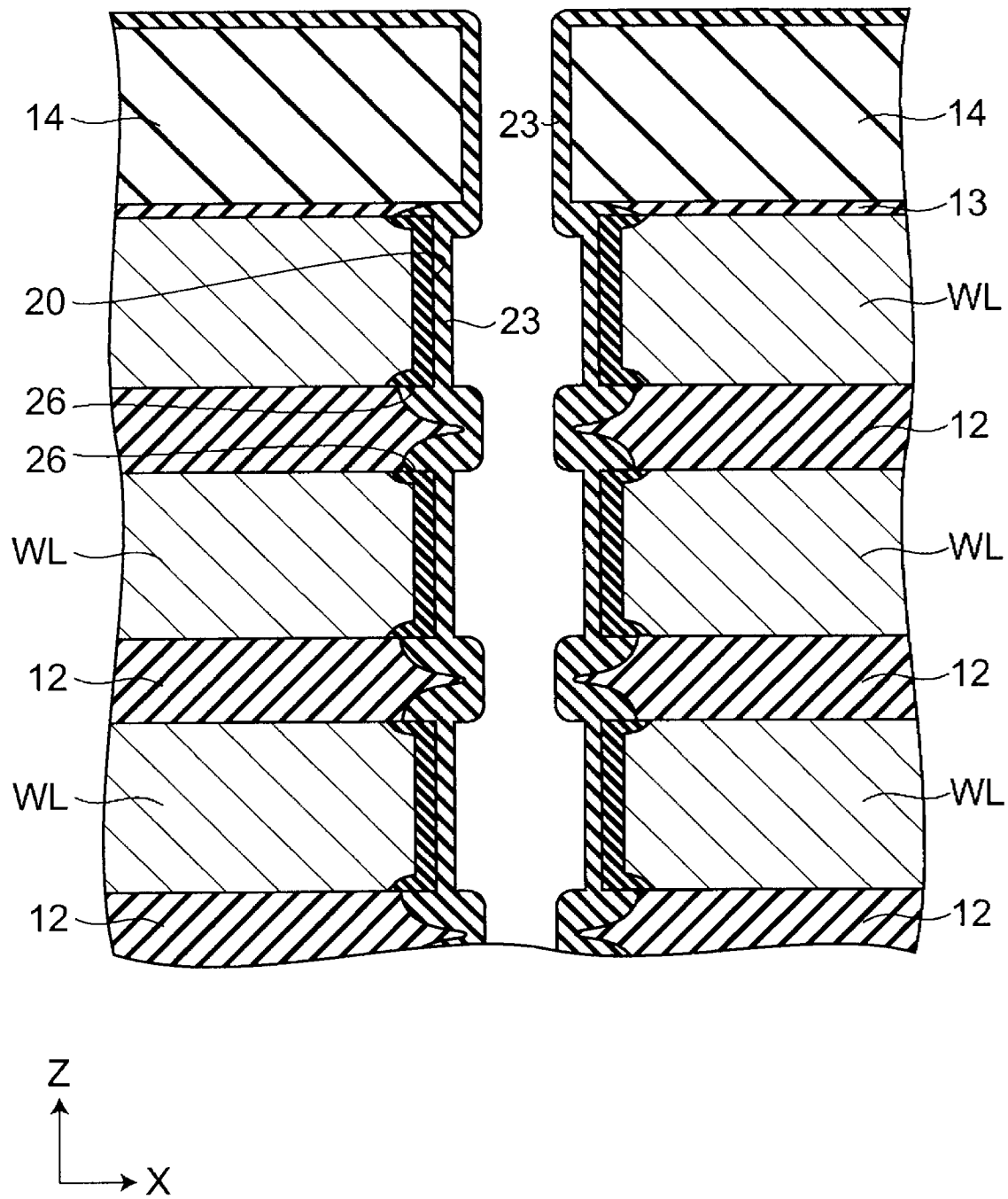
FIG. 8 is a process cross-sectional view illustrating the method for manufacturing the nonvolatile semiconductor memory device according to this embodiment.

Next, as shown in FIG. 8, silicon nitride is deposited illustratively by CVD to form a charge storage layer 23. The charge storage layer 23 is formed on the entire surface, that is, entirely on the side surface and the bottom surface of the through hole 20 and the upper surface of the silicon nitride film 14. Here, the charge storage layer 23 is buried also in the recess 26.

Figure 9:
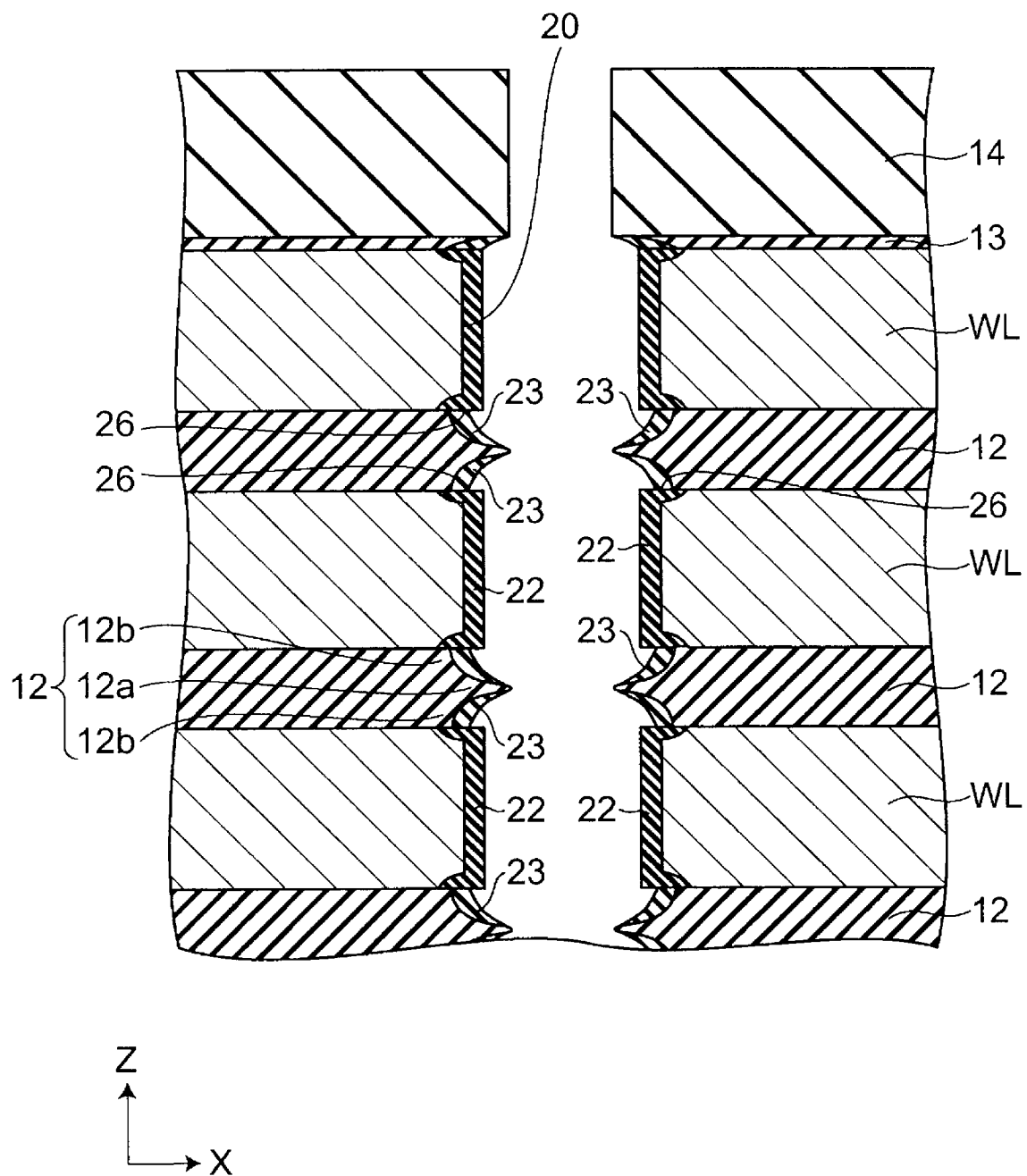
FIG. 9 is a process cross-sectional view illustrating the method for manufacturing the nonvolatile semiconductor memory device according to this embodiment.

Next, as shown in FIG. 9, wet etching or CDE is performed through the through hole 20 to etch the charge storage layer 23. Thus, the charge storage layer 23 is left in the recess 26 and on the side surface of the silicon oxide film 13, and removed from elsewhere. That is, the charge storage layer 23 is removed from the side surface of the center portion 12a of the insulating film 12, the side surface of the electrode film WL, and the side surface and the upper surface of the silicon nitride film 14.

Next, as shown in FIGS. 2 and 3, silicon oxide is deposited on the entire surface illustratively by CVD to form a tunnel insulating layer 21. Here, the tunnel insulating layer 21 is formed on the side surface of the block insulating layer 22, the side surface of the charge storage layer 23, and the side surface of the center portion 12a of the insulating film 12 to enclose the charge storage layer 23 left in the recess 26.

Next, silicon is deposited and etched back to form a protective film (not shown) made of silicon on the side surface and the bottom surface of the through hole 20. Next, etching is performed to remove the protective film, the tunnel insulating layer 21, and the block insulating layer 22 formed on the bottom surface of the through hole 20. Next, dilute hydrofluoric acid treatment is performed to remove natural oxide film formed on the upper surface of the lower portion of the silicon pillar SP.

Next, amorphous silicon is buried inside the through hole 20. Thus, the center portion of the silicon pillar SP is buried in the through hole 20. The center portion of the silicon pillar SP is connected to the lower portion of the silicon pillar SP buried in the lower gate stacked body. At this time, by controlling the amount of silicon buried, a void 15 is continuously or intermittently formed along the center line of the silicon pillar SP.

Next, as shown in FIG. 1, an insulating film (not shown) illustratively made of silicon oxide is formed on the memory stacked body, an upper select gate USG is formed illustratively by depositing amorphous silicon, and an insulating film (not shown) illustratively made of silicon oxide is formed. Thus, an upper gate stacked body including the upper select gate USG is formed. Next, a through hole (not shown) is formed in the upper gate stacked body, and amorphous silicon is buried in this through hole to form the upper portion of the silicon pillar SP. At this time, the lower portion, the center portion, and the upper portion of the silicon pillar SP are integrally connected to form a silicon pillar SP extending in the Z direction. Next, interconnects such as contact holes and bit lines BL are formed. Thus, the nonvolatile semiconductor memory device 1 is manufactured.

Next, the operation of this embodiment is described.

In the nonvolatile semiconductor memory device 1 according to this embodiment, the silicon pillar SP functions as a body region, the electrode film WL functions as a control gate, and the charge storage layer 23 functions as a charge trap. Thus, a cell transistor is formed at each intersection between the silicon pillar SP and the electrode film WL. This cell transistor constitutes a memory cell.

Consequently, as many memory cells as the electrode films WL are arranged in a line in the Z direction along one silicon pillar SP and therearound to constitute one memory string.

Furthermore, a plurality of silicon pillars SP are arranged in a matrix configuration along the X and Y direction. Thus, in the memory stacked body, a plurality of memory cells are three-dimensionally arranged along the X, Y, and Z direction.

In the device 1, the X coordinate of a memory cell is selected by selecting a bit line BL, the Y coordinate of the memory cell is selected by selecting an upper select gate USG to bring the upper portion of the silicon pillar SP into the conducting or non-conducting state, and the Z coordinate of the memory cell is selected by selecting an electrode film WL serving as a word line. Then, information is stored by injecting electrons into the charge storage layer 23 in the selected memory cell. Furthermore, the threshold of the cell transistor depends on whether electrons have been injected into the charge storage layer 23. Thus, this phenomenon is used to read information stored in the memory cell. That is, the bit line BL connected to the memory cell to be read is precharged, the upper and lower portion of the silicon pillar SP penetrating through this memory cell is brought into the conducting state, and the other cell transistors penetrated by this silicon pillar SP are brought into the conducting state. Then, no current flows if the threshold of the cell transistor to be read is high, whereas a current flows if the threshold is low.

At this time, electrons stored in the charge storage layer 23 are subjected to a force in the direction of distancing them from each other by the self-field produced by these electrons themselves. Furthermore, when a potential is applied to the electrode film WL of the adjacent memory cell, the force resulting form this potential also acts on the electrons. Thus, if there is a path allowing migration of the electrons stored in the charge storage layer 23, these electrons may be lost from the memory cell by diffusion or migration.

However, in this embodiment, the charge storage layer 23 provided between each insulating film 12 and the silicon pillar SP is divided by the center portion 12a of the insulating film 12, and electrically isolated between the memory cells adjacent in the Z direction. Thus, no path for hopping conduction of electrons injected into the charge storage layer 23 is formed in the region between the memory cells. Consequently, no electrons stored in the charge storage layer 23 of a memory cell diffuse or migrate to the adjacent memory cell.

Next, the effect of this embodiment is described.

As described above, in the nonvolatile semiconductor memory device 1 according to this embodiment, the charge storage layers 23 are electrically isolated from each other. Hence, electrons injected into a memory cell are not lost by diffusion or migration. Thus, the device 1 has small interference between memory cells despite downscaling, and can maintain reliability in retaining data in memory cells.

Furthermore, in this embodiment, the charge storage layer 23 is not provided between the electrode film WL and the silicon pillar SP. Thus, the charge storage layers 23 located above and below each electrode film WL are isolated from each other. Hence, two bits of data can be stored in each memory cell.

Moreover, in this embodiment, the charge storage layer 23 is provided on the upper and lower side of each electrode film WL, and not provided between the electrode film WL and the silicon pillar SP. Furthermore, the block insulating layer 22 is also formed by oxidation of part of the electrode film WL. Hence, only the tunnel insulating layer 21 is formed on the side surface of the through hole 20. Thus, the inner diameter of the through hole 20 can be decreased while designing the silicon pillar SP to have an outer diameter necessary for current flow therethrough and maintaining the necessary thickness of the tunnel insulating layer 21, the block insulating layer 22, and the charge storage layer 23. Consequently, in the nonvolatile semiconductor memory device 1 according to this embodiment, the planar structure can be downscaled.

Next, a comparative example of this embodiment is described.

Figure 10:
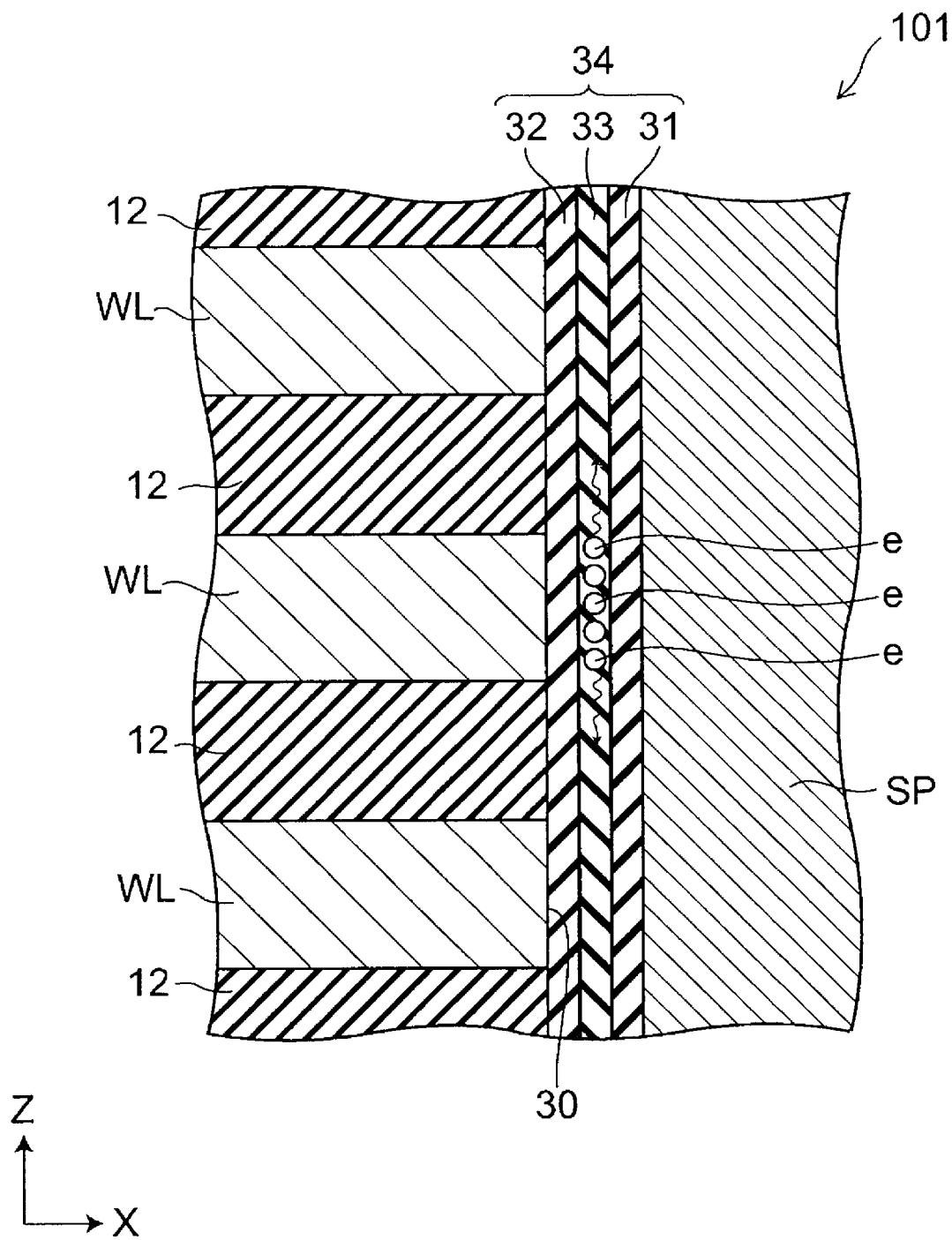
FIG. 10 is a cross-sectional view illustrating a nonvolatile semiconductor memory device according to a comparative example.

FIG. 10 is a cross-sectional view illustrating a nonvolatile semiconductor memory device according to this comparative example.

As shown in FIG. 10, in the nonvolatile semiconductor memory device 101 according to this comparative example, the side surface of the through hole 30 is shaped like a generally straight line in the cross section parallel to the Z direction, and an ONO film (oxide-nitride-oxide film) 34 is provided on this side surface of the through hole 30. The ONO film 34 includes a block insulating layer 32 made of silicon oxide, a charge storage layer 33 made of silicon nitride, and a tunnel insulating layer 31 made of silicon oxide stacked in this order from outside, that is, the electrode film WL side.

In the nonvolatile semiconductor memory device 101 according to this comparative example, the charge storage layer 33 is formed along the side surface of the through hole 30, and continuously formed across a plurality of memory cells arranged in the Z direction. Thus, electrons e stored in the portion of the charge storage layer 33 belonging to one memory cell are subjected to a force resulting from the self-field or the potential of the adjacent electrode film WL, and diffuse or migrate by hopping conduction through levels in the charge storage layer 33. Consequently, the amount of charge stored in one memory cell decreases over time and results in decreasing the amount of signal, and the memory cell fails to retain data. Furthermore, electrons diffused from one memory cell and reaching the adjacent memory cell that shares the charge storage layer 33 vary the threshold of the cell transistor of this adjacent memory cell and overwrite data. Such interference between memory cells becomes noticeable with the downscaling of the device 101. Hence, in the device according to this comparative example, interference between memory cells increases with its downscaling.

Furthermore, in the nonvolatile semiconductor memory device 101 according to this comparative example, the charge storage layer 33 is not divided in the memory cell. Hence, each memory cell can store only one bit of data.

Moreover, the block insulating layer 32, the charge storage layer 33, and the tunnel insulating layer 31 are provided on the side surface of the through hole 30, that is, between the electrode film WL and the silicon pillar SP. Here, the charge storage layer 33 needs to have at least a certain thickness for the purpose of ensuring electron trapping probability to store a sufficient amount of charge. Furthermore, the tunnel insulating layer 31 also needs to have at least a certain thickness for the purpose of preventing loss of charge stored in the charge storage layer 33 to maintain good retention characteristics. Moreover, the block insulating layer 32 also needs to have at least a certain thickness for the purpose of preventing reverse injection of holes from the electrode film WL into the charge storage layer 33 during programming data to store a sufficient amount of charge in the charge storage layer 33 and preventing reverse injection of electrons from the electrode film WL into the charge storage layer 33 during erasing data to reliably erase data. If these layers are lacking in thickness, the charge storage layer 33 cannot store a sufficient amount of charge, failing to ensure the data window, which is the difference of threshold voltage between data "0" and data "1". Furthermore, the silicon pillar SP also needs to have at least a certain diameter for the purpose of passing a sense current. Thus, in this comparative example, the diameter of the through hole 30 is difficult to reduce, and the downscaling of the planar structure is difficult.

Next, examples of the above embodiment of the invention are described.

To begin with, a first example is described.

Figure 11:
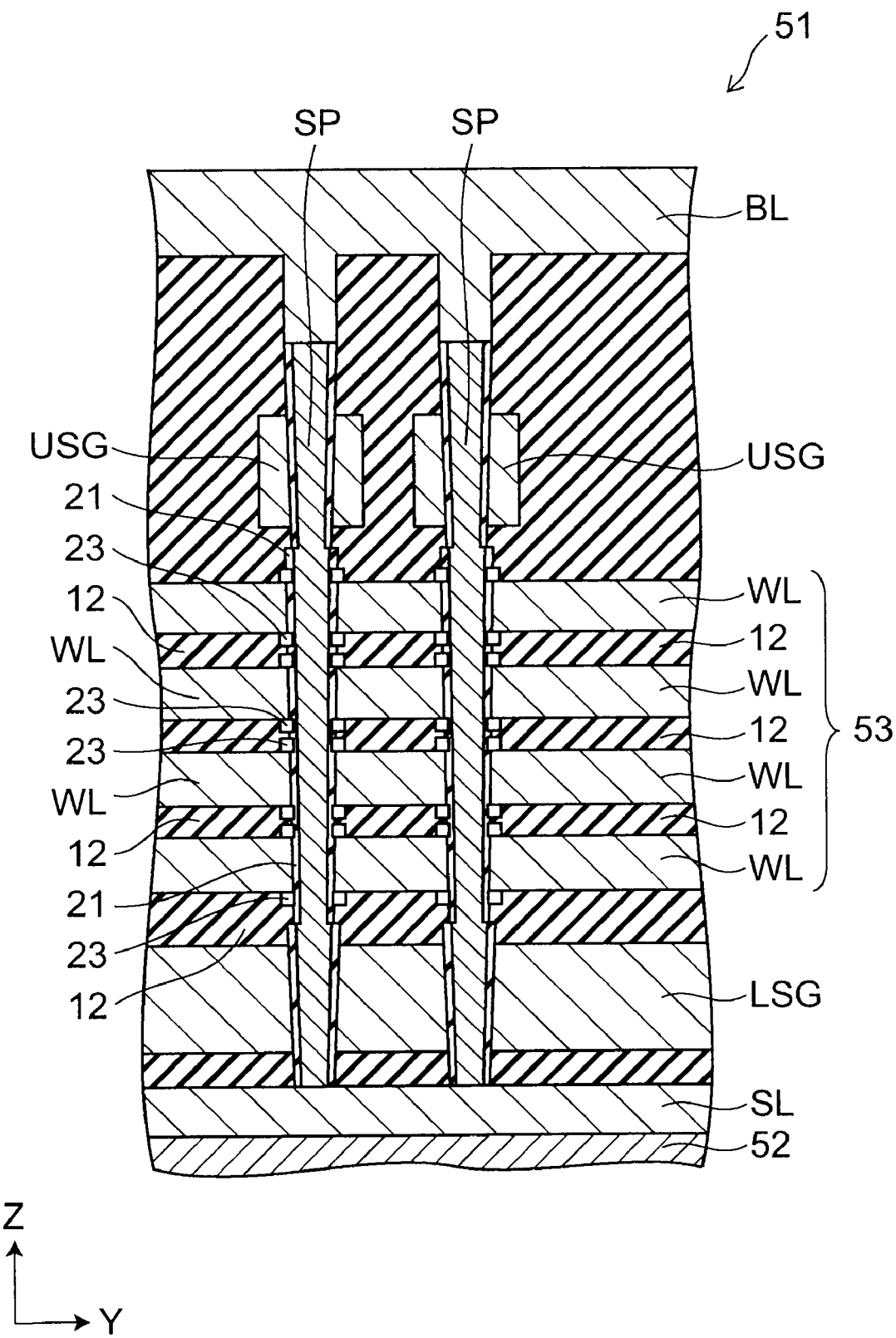
FIG. 11 is a cross-sectional view illustrating a nonvolatile semiconductor memory device according to a first example of this embodiment.

FIG. 11 is a cross-sectional view illustrating a nonvolatile semiconductor memory device according to this example.

In FIG. 11, for convenience of illustration, the fine structure of each memory cell is not shown. The structure of each memory cell is the same as the structure shown in FIGS. 2 and 3.

As shown in FIG. 11, in the nonvolatile semiconductor memory device 51 according to this example, a source line SL made of a diffusion region is formed in a silicon substrate 52. Furthermore, a lower select gate LSG, a memory stacked body 53, and an upper select gate USG are stacked in this order on the silicon substrate 52, and a bit line BL is provided thereon. In the memory stacked body 53, a plurality of electrode films WL serving as word lines are stacked. A silicon pillar SP is connected between the bit line BL and the source line SL. The silicon pillar SP has an I-shape linearly extending in the Z direction and penetrates through the upper select gate USG, the plurality of electrode films WL, and the lower select gate LSG. The configuration, operation, and effect of this example other than the foregoing are the same as those of the above embodiment.

Next, a second example is described.

Figure 12:
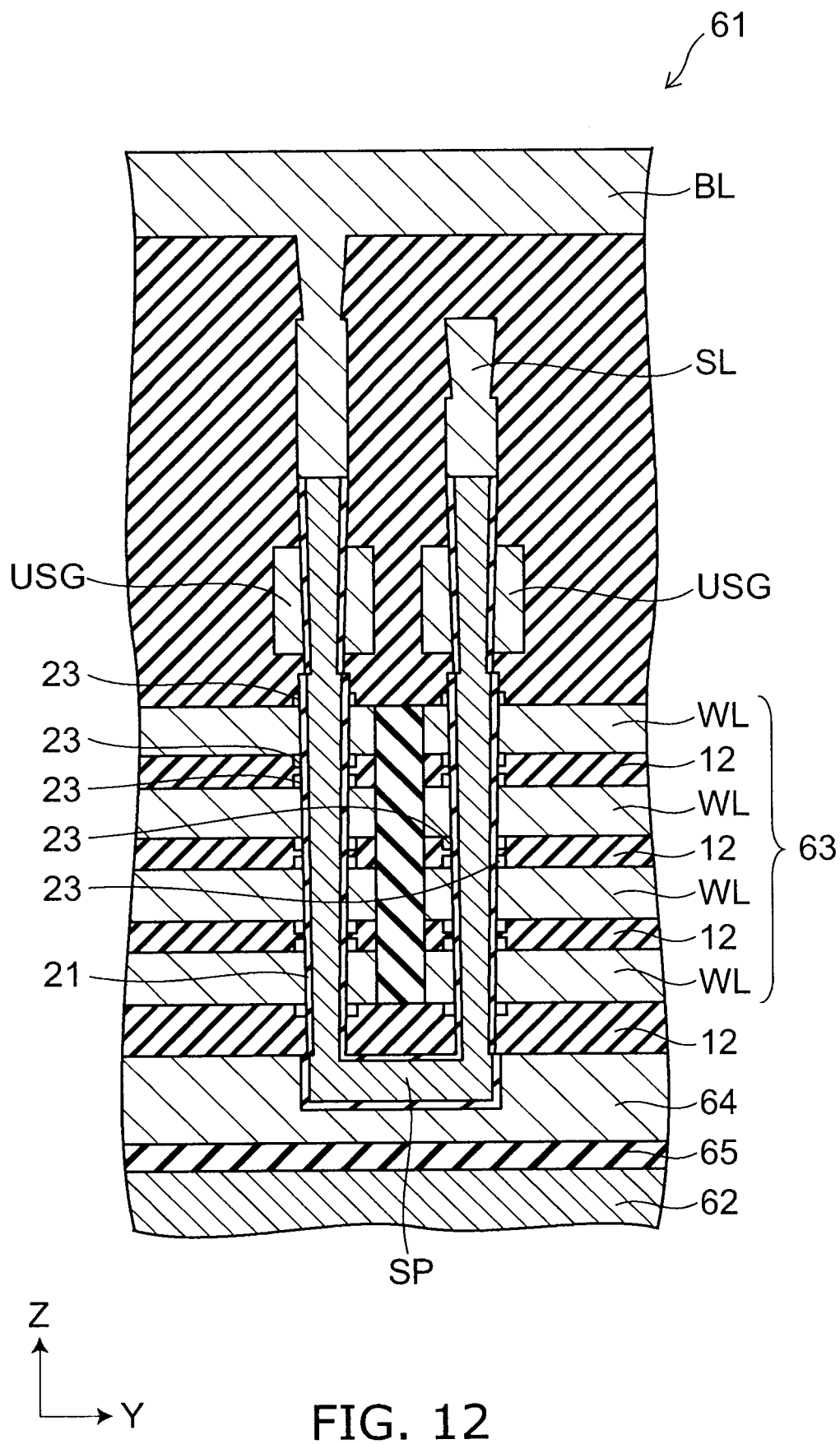
FIG. 12 is a cross-sectional view illustrating a nonvolatile semiconductor memory device according to a second example of this embodiment.

FIG. 12 is a cross-sectional view illustrating a nonvolatile semiconductor memory device according to this example.

Also in FIG. 12, for convenience of illustration, the fine structure of each memory cell is not shown. The structure of each memory cell is the same as the structure shown in FIGS. 2 and 3.

As shown in FIG. 12, in the nonvolatile semiconductor memory device 61 according to this example, a silicon oxide layer 65, a silicon layer 64, a memory stacked body 63, and an upper select gate USG are stacked in this order on a support substrate 62, and a source line SL and a bit line BL are provided thereon. It is noted that no lower select gate LSG (see FIG. 11) is provided. The source line SL extends in the X direction, and the bit line BL extends in the Y direction and is provided above the source line SL. In the memory stacked body 63, a plurality of electrode films WL are stacked.

Furthermore, a U-shaped silicon pillar SP is connected between the source line SL and the bit line BL. That is, the silicon pillar SP once extending downward from the bit line BL penetrates through the upper select gate USG and the plurality of electrode films WL, turns around in the silicon layer 64 and heads upward, penetrates again through the plurality of electrode films WL and the upper select gate USG, and reaches the source line SL. The turn-around portion of the silicon pillar SP is insulated from the silicon layer 64 by a stacked film (see FIG. 2) of the tunnel insulating layer 21 and the block insulating layer 22. In a pair of vertical portions provided in the U-shaped silicon pillar SP, the electrode films WL surrounding one vertical portion are separated and insulated from the electrode films WL surrounding the other vertical portion.

According to this example, the source line SL can be formed after the electrode films WL are formed. Hence, like the bit line BL, the source line SL can be formed from a metal. Thus, the interconnect resistance of the source line SL can be reduced. Furthermore, there is no need to connect the silicon pillar SP to a silicon member. Hence, there is no need for dilute hydrofluoric acid treatment to remove natural oxide film from the surface of the silicon member, avoiding damage to the gate insulating film, the tunnel insulating film and the like due to dilute hydrofluoric acid treatment. The configuration, operation, and effect of this example other than the foregoing are the same as those of the above embodiment.

The invention has been described with reference to the embodiment and examples. However, the invention is not limited to the embodiment and examples. For example, those skilled in the art can suitably modify the above embodiment or examples by addition, deletion, or design change of components, or by addition, omission, or condition change of processes, and such modifications are also encompassed within the scope of the invention as long as they fall within the spirit of the invention.

The invention claimed is:

1. A nonvolatile semiconductor memory device comprising:
 a stacked body with a plurality of insulating films and electrode films alternately stacked therein, through which a through hole extending in a stacking direction is formed;
 a semiconductor pillar buried inside the through hole; and
 a charge storage layer located on both sides of each of the electrode films in the stacking direction and insulated from the electrode films and the semiconductor pillar,
 a center portion of the plurality of insulating films in the stacking direction protruding toward the semiconductor pillar from a peripheral portion of the plurality of insulating films in the stacking direction.

2. The memory device according to claim 1, further comprising:
 a tunnel insulating layer provided between the charge storage layer and the semiconductor pillar; and
 a block insulating layer provided between the charge storage layer and the electrode films.

3. The memory device according to claim 2, wherein the tunnel insulating layer is formed entirely on the side surface of the through hole.

4. The memory device according to claim 2, wherein the block insulating layer extends out away from the through hole so as to wrap around a corner of the electrode films facing the through hole.

5. The memory device according to claim 2, wherein the charge storage layer is surrounded by the plurality of insulating films, the block insulating layer, and the tunnel insulating layer.

6. The memory device according to claim 1, wherein the charge storage layer is provided, two for each intersection between the semiconductor pillar and the electrode films.

7. The memory device according to claim 1, wherein the charge storage layer has an annular shape surrounding the semiconductor pillar.

8. The memory device according to claim 1, wherein the charge storage layer is formed from silicon nitride.

9. The memory device according to claim 1, wherein the electrode films are formed from silicon doped with impurities, and the plurality of insulating films is formed from silicon oxide.

10. A nonvolatile semiconductor memory device comprising:
 a stacked body with a plurality of insulating films and electrode films alternately stacked therein, through which a through hole extending in a stacking direction is formed;
 a semiconductor pillar buried inside the through hole;
 a charge storage layer located on both sides of each of the electrode films in the stacking direction and insulated from the electrode films and the semiconductor pillar;
 a tunnel insulating layer provided between the charge storage layer and the semiconductor pillar; and
 a block insulating layer provided between the charge storage layer and the electrode films,
 the charge storage layer being not provided between a center portion of the plurality of insulating films in the stacking direction and the tunnel insulating layer.

11. A nonvolatile semiconductor memory device comprising:
 a stacked body with a plurality of insulating films and electrode films alternately stacked therein, through which a through hole extending in a stacking direction is formed;
 a semiconductor pillar buried inside the through hole;
 a charge storage layer located on both sides of each of the electrode films in the stacking direction and insulated from the electrode films and the semiconductor pillar,
 the charge storage layer is not provided between the electrode films and the semiconductor pillar.

* * * * *